United States Patent
Pu et al.

(10) Patent No.: US 9,065,022 B2
(45) Date of Patent: Jun. 23, 2015

(54) LIGHT EMITTING APPARATUS

(71) Applicant: FORMOSA EPITAXY INCORPORATION, Taoyuan County (TW)

(72) Inventors: Chi-Chih Pu, Taoyuan County (TW); Chen-Hong Lee, Taoyuan County (TW); Shih-Yu Yeh, Taoyuan (TW); Wei-Kang Cheng, Taoyuan (TW); Shyi-Ming Pan, Taoyuan (TW); Siang-Fu Hong, Taoyuan (TW); Chih-Shu Huang, Taoyuan (TW); Tzu-Hsiang Wang, Taoyuan (TW); Shih-Chieh Tang, Taoyuan (TW); Cheng-Kuang Yang, Taoyuan (TW)

(73) Assignee: Formosa Epitaxy Incorporation, Taoyuan County (TW)

(*) Notice: Subject to any disclaimer, the term of this patent is extended or adjusted under 35 U.S.C. 154(b) by 176 days.

(21) Appl. No.: 13/845,160

(22) Filed: Mar. 18, 2013

(65) Prior Publication Data
US 2013/0322072 A1 Dec. 5, 2013

(30) Foreign Application Priority Data

| | | | |
|---|---|---|---|
| May 29, 2012 | (TW) | ............................ | 101119098 A |
| Jun. 19, 2012 | (TW) | ............................ | 101121921 A |
| Jul. 16, 2012 | (TW) | ............................ | 101125599 A |
| Aug. 28, 2012 | (TW) | ............................ | 101131198 A |
| Aug. 30, 2012 | (TW) | ............................ | 101131643 A |
| Sep. 4, 2012 | (TW) | ............................ | 101132185 A |
| Sep. 4, 2012 | (TW) | ............................ | 101132187 A |

(51) Int. Cl.
*F21V 21/00* (2006.01)
*H01L 33/50* (2010.01)
*F21V 21/14* (2006.01)
*H01L 33/48* (2010.01)
*H01L 25/075* (2006.01)

(52) U.S. Cl.
CPC ............... *H01L 33/50* (2013.01); *F21V 21/00* (2013.01); *F21V 21/14* (2013.01); *H01L 25/0753* (2013.01); *H01L 33/486* (2013.01); *H01L 2224/48091* (2013.01); *H01L 2224/49107* (2013.01); *H01L 2924/3025* (2013.01)

(58) Field of Classification Search
CPC .................................. F21V 21/00; F21V 24/14
USPC ................................. 362/234, 249.01–249.04
See application file for complete search history.

(56) References Cited

U.S. PATENT DOCUMENTS 5,963,280 A * 10/1999 Okuda et al. ..................... 349/65

* cited by examiner

*Primary Examiner* — Vip Patel
(74) *Attorney, Agent, or Firm* — Rosenberg, Klein & Lee

(57) ABSTRACT

The present invention relates to a light emitting apparatus comprising at least one light emitting device and a support mechanism. The light emitting device includes a transparent substrate which light can pass through; at least one LED chip emitting light omni-directionally is disposed on one surface of the substrate, and the light emitted by the LED chip will penetrate into the substrate and at least partially emerge from another surface of the substrate. The support mechanism is coupled to the light emitting device; a first angle is formed between the substrate and the support mechanism. According to the present invention, the light emitting apparatus using LED chips can provide sufficient lighting intensity and uniform lighting performance.

23 Claims, 15 Drawing Sheets

LIGHT EMITTING APPARATUS

FIELD OF THE INVENTION

The present invention relates to a light emitting device comprising semiconductor light emitting diode (LED) chips, and particularly to a light emitting device comprising at least one LED chip which emits light omni-directionally, and a light emitting apparatus using same.

BACKGROUND OF THE INVENTION

In the field of lighting technology, the development trends for light sources are low cost, environmental friendliness, and power saving in order to acquire better lighting performance under the condition of consuming less power. These trends make LEDs play an important role in the development.

Practically, there are still limitations and challenges for applying LEDs or similar light emitting units to lamps for lighting. In the past, using LEDs as a light source called for depositing multiple LED chips on a plane and further providing an optical reflection mechanism to guide or broadcast the light emitted from the LED chips emitting light directionally in the beginning.

This kind of arrangement described above was not appropriate to substitute for traditional lamps with wide lighting angles. Because only a portion of light generated by the LED chips propagated in the direction of lighting while the other portions were absorbed or lost during the reflection processes, the lighting efficiency was low and the number of the LED chips must be increased for compensation and meeting the brightness requirement for lighting. Therefore the cost of the tradition LED lamp was high and the benefit for saving energy was insufficient.

Moreover, in traditional LED lamps, the substrates on which LED chips were deposited were planar, firm, and opaque. Thereby, the flexibility of disposing LED chips was limited. For example, when the substrates were non-planar, the light generated by the LED chips deposited on the substrates would be shielded or blocked accordingly, which was unfavorable for reducing power consumption and costs of traditional LED lamps.

SUMMARY

An objective of the present invention is to provide a light emitting device with high reliability, high lighting efficiency, and low cost.

Another objective of the present invention is to provide a light emitting apparatus comprising multiple light emitting devices arranged symmetrically or asymmetrically for enhancing the light intensity of the light emitting apparatus. Meanwhile, the lighting uniformity for various directions can be maintained and the required light shapes can be provided.

Still another objective of the present invention is to provide a light emitting apparatus comprising a lamp housing for applying to lamps, signboards or backlight units.

Accordingly, for achieving the objectives described above, the present invention discloses a light emitting apparatus comprising at least one light emitting device and a support mechanism. The light emitting device includes a transparent substrate which light can pass through and which has a support surface. At least one LED chip comprising multiple light emitting surfaces and emitting light omni-directionally is disposed on the support surface of the substrate, and one of the light emitting surfaces of the LED chip and the support surface form an illuminant first main surface. Because the light emitting angle of the LED chip is wider than 180°, the light emitted by the LED chip will penetrate into the substrate and at least partially emerge from a second main surface corresponding to the first main surface of the substrate. The support mechanism is coupled to the light emitting device; a first angle is formed between the substrate and the support mechanism. According to the present invention, the light emitting apparatus using LED chips can provide sufficient lighting intensity and uniform lighting performance. Additionally, the number and the arrangement of the substrates of the present invention can be modified for adjusting brightness, so the light emitting apparatus has more flexibility for various applications.

DETAILED DESCRIPTION

Figure 1A:
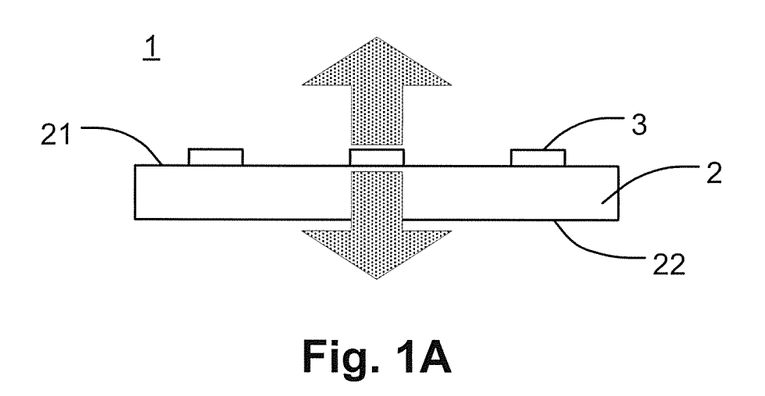
FIGS. 1A~1B show structural schematic diagrams of the light emitting device according to the embodiments of the present invention.
Figure 1B:
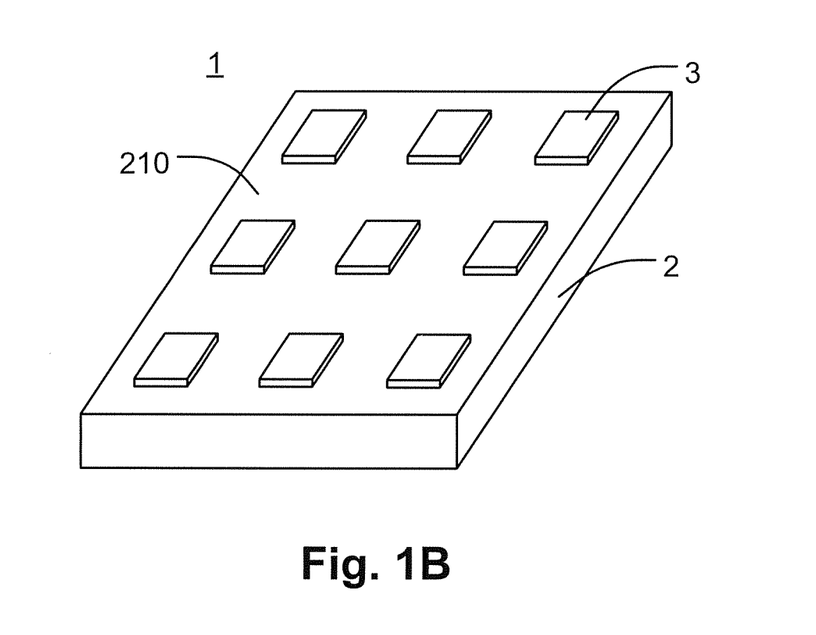

As shown in FIGS. 1A and 1B, the first embodiment of the present invention discloses a light emitting device 1 comprising a transparent substrate 2 which light can pass through, a support surface 210, a first main surface 21, a second main surface 22, and at least one LED chip 3 emitting light omnidirectionally.

Wherein the number of the LED chips 3 deposited on the support surface 210 of the sheet-shaped substrate 2 according to the embodiment is 9, and the embodiment arranges the LED chips 3 as a 3×3 matrix. The LED chip 3 comprises multiple light emitting surfaces, and one of the light emitting surfaces 34 and the support surface 210 form the illuminant first main surface 21 of the light emitting device 1. Because the light emitting angle of the LED chip 3 is wider than 180°, at least a portion of light emitted from the LED chip 3 will penetrate into the substrate 2 from the support surface 210 and pass through the substrate 2. Then the incident light in the substrate 2 will at least partially emerge from the second main surface 22 and/or the first main surface 21 of the light emitting device 1.

The material of the substrate 2 can be aluminum oxide, sapphire containing aluminum oxide, glass, plastics, or rubber. According to a preferred embodiment of the present invention, a sapphire substrate is adopted for its essentially single crystal structure and better light transmissivity. In addition, it has superior capability in heat dissipation, which can extend the lifetime of the light emitting device 1. However, traditional sapphire substrates have the problem of cracking when being assembled with other units of the light emitting apparatus. In order to solve this reliability problem, the thickness of the substrate 2 of the present invention should be greater than or equal to 200 µm as verified by experiments for practical applications.

Moreover, according to the present invention, the difference between color temperatures of the light emerging from the first main surface 21 and the light emerging from the second main surface 22 is set equal to or smaller than 1500K by adjusting the parameters of the substrate 2, thickness or composition for example, or phosphor deposited thereon. Therefore, the light emitting device 1 of the present invention has an overall consistent lighting performance. According to another embodiment of the present invention, the light transmissivity of the substrate 2 is set greater than or equal to 70% when the range of the wavelength of the incident light is 420~470 nm with the thickness of the substrate 2 being the value described above.

Figure 2A:
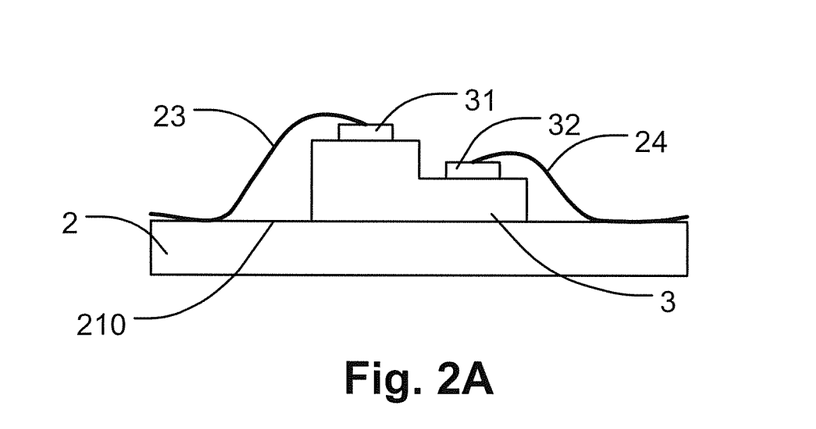
FIGS. 2A~2C show schematic diagrams of the light emitting device comprising the LED chip in various forms coupled to the conductors according to the embodiments of the present invention.
Figure 2B:
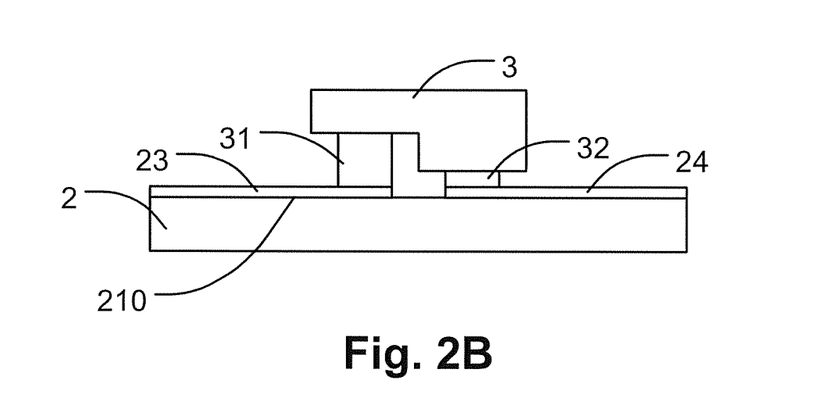
Figure 2C:
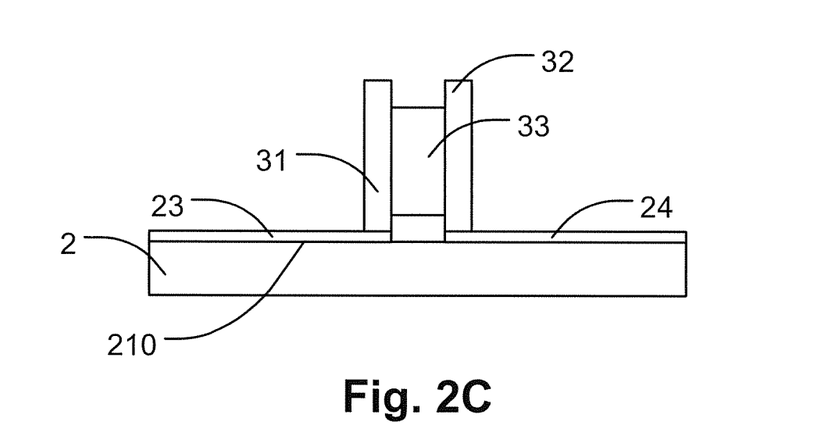

As shown in FIGS. 2A~2C, there are further embodiments of the present invention. For acquiring power for emitting light, an LED chip 3 of a light emitting device according to the present invention includes a first electrode 31 and a second electrode 32 coupled electrically with a first conductor 23 and a second conductor 24 located on the substrate 2 respectively. More particularly, FIG. 2A shows a lateral type LED chip 3 deposited on the substrate 2 and coupled with the conductors 23, 24 by wire bonding; FIG. 2B shows a flip-chip type LED chip 3 deposited on the substrate 2 and coupled with the conductors 23, 24 by chip bonding wherein the conductors are circuit patterns on the substrate 2. FIG. 2C shows an LED chip 3 having the electrodes 31, 32 disposed on both sides of the epitaxial layers 33 respectively, and the LED chip 3 is vertically deposited on the substrate 2 with the edges of the electrodes 31, 32 connected to the conductors 23, 24.

Figure 3A:
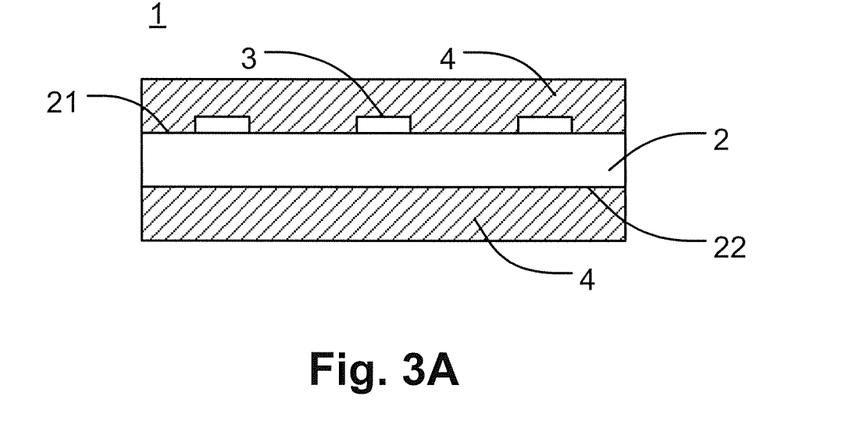
FIGS. 3A~3B show schematic diagrams of the light emitting device comprising the wavelength conversion layer according to the embodiments of the present invention.
Figure 3B:
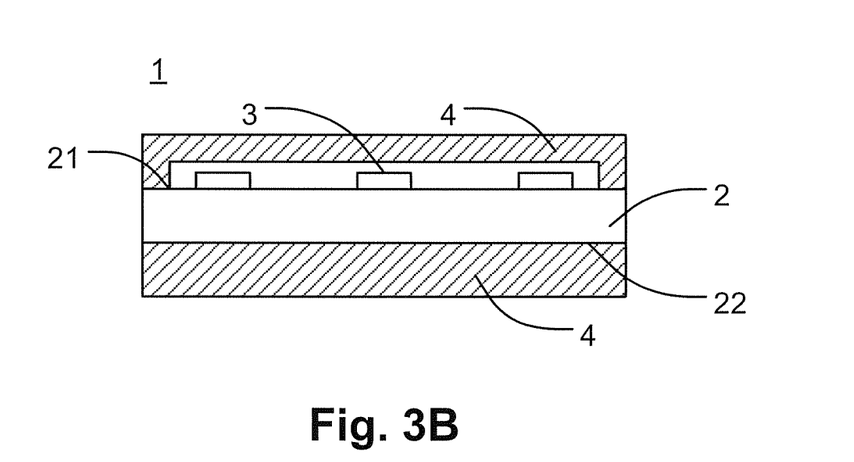

As shown in FIGS. 3A~3B, there are further embodiments of the present invention. A light emitting device 1 according to the present invention further includes a wavelength conversion layer 4, which is disposed on a first main surface 21 or/and a second main surface 22 of the light emitting device 1. Alternatively, the wavelength conversion layer 4 can be disposed on an LED chip 3 directly (not shown in the figures). According to the embodiments of the present invention as shown in the figures, the wavelength conversion layers 4 including at least one kind of fluorescent powder receive at least a portion of light emitting from the main surfaces 21, 22 and convert to the light with different wavelength. According to one embodiment shown in FIG. 3A, one of the wavelength conversion layers 4 encapsulates and contacts the LED chip 3 directly. According to another embodiment shown in FIG. 3B, one of the wavelength conversion layers 4 covers the LED chip 3 and forms a space between the wavelength conversion layer 4 and the substrate 2 for receiving/converting at least a portion of the light emitted by the LED chip 3 to the light with different wavelength. For example, when the LED chip 3 emits blue light the wavelength conversion layer 4 converts a portion of the blue light to yellow light. Then the light emitting device 1 will eventually emit white light by mixing the blue light and the yellow light. Additionally, the space can be filled with other materials like epoxy, air, phosphor, etc., according to various optics and reliability requirements.

The intensity of the light from the first main surface 21 is slightly different from the intensity of the light from the second main surface 22. In addition, as described earlier, the further embodiment of the present invention is to set the difference in color temperatures of the emerging light equal to or smaller than 1500K. Additionally, according to a preferred embodiment of the present invention, the ratio of the quantity of the fluorescent powder in the wavelength conversion layer 4 on the first main surface 21 to that on the second main surface 22 is 1:0.5 to 1:3, or other values in order to improve the wavelength conversion efficiency and the light emitting performance of the light emitting device 1.

Figure 4:
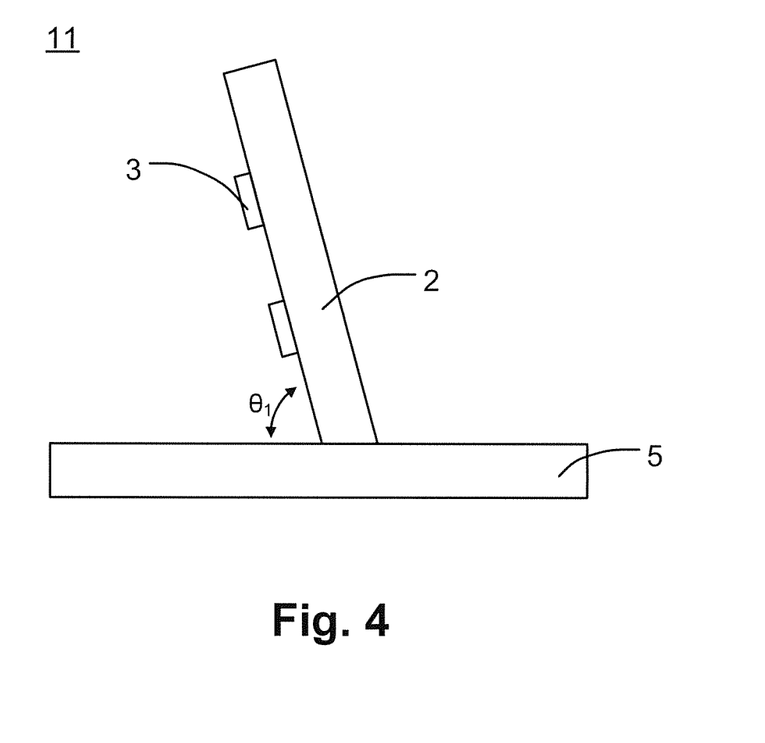
FIG. 4 shows a schematic diagram of the light emitting apparatus comprising the support base according to one embodiment of the present invention.
Figure 5A:
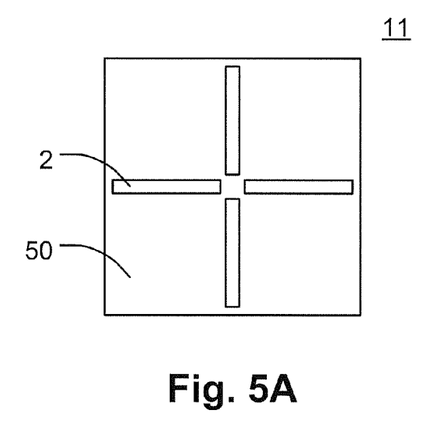
FIGS. 5A~5D show top views of the arrangement of the light emitting device deposited on the support mechanism of the light emitting apparatus point- or line-symmetrically according to the embodiments of the present invention.
Figure 5B:
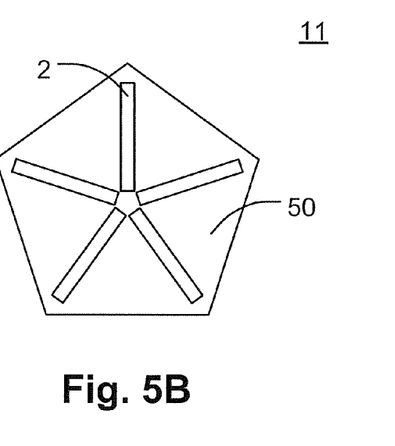
Figure 5C:
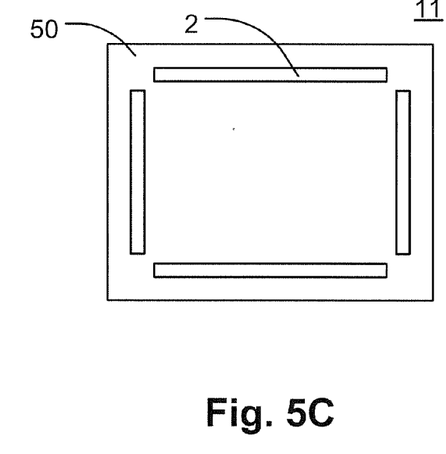
Figure 5D:
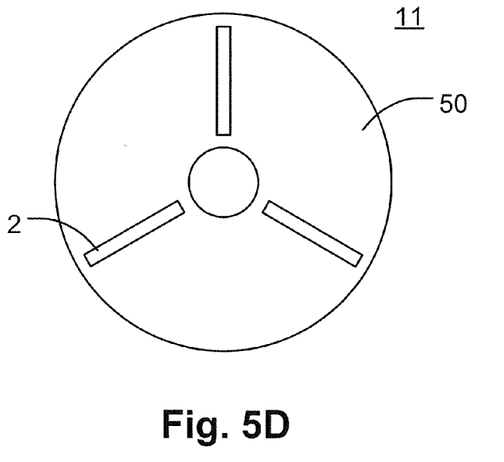

As shown in FIG. 4, a light emitting apparatus of the present invention comprises a light emitting device 1 as described in the previous embodiments and a support base 5. Wherein the substrate 2 couples to the support base 5 for forming a light emitting apparatus 11, and there is a first angle $\theta_1$ between the substrate 2 and the support base 5. The first angle $\theta_1$ is adjustable according to the required light shape of the light emitting apparatus. According to a preferred embodiment, the first angle $\theta_1$ ranges from 30° to 150°.

As shown in FIGS. 5A~5D, a light emitting apparatus 11 according to further embodiments of the present invention further comprises multiple light emitting devices 1 for enhancing the brightness and meeting different light shape requirements. Users can dispose the light emitting devices 1 comprising a plurality of substrates 2 on a support mechanism 50 such as the support base 5 at the same time. The arrangement can be symmetrical or asymmetrical. The preferred arrangement is to dispose the multiple substrates 2 point-symmetrically or line-symmetrically on the support mechanism 50, so that the light emission of the overall light emitting apparatus 11 can be uniform. (The LED chips 3 are omitted in the figures.) Particularly, the shape of the support mechanism 50 can be a polygon, square, rectangle or regular hexagon for example, or circle or even a hollow circle or a hollow polygon for various applications. According to another embodiment, at least a portion of multiple light emitting devices 1 is disposed concentratively or dispersively in an asymmetrical manner for meeting the requirement in the light shapes of the light emitting apparatus 11 in various applications (not shown in the figures).

Figure 6:
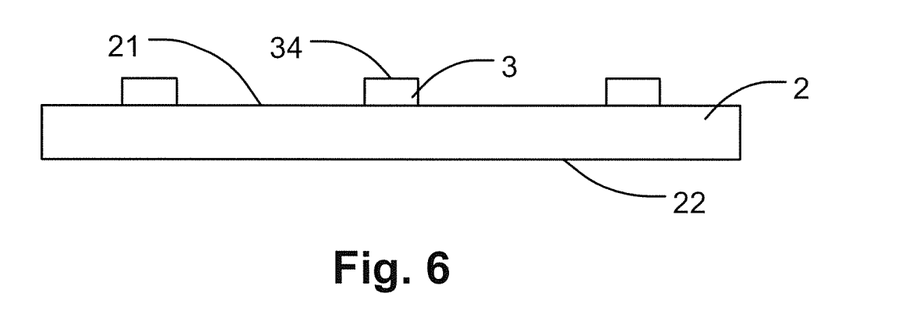
FIG. 6 shows a schematic diagram of the light emitting device comprising the LED chips with light emitting surfaces according to one embodiment of the present invention.

In the present invention, the support base 5 or the support mechanism 50 can be a multi-functional base for supporting, supplying power, connecting, and dissipating heat simultaneously. The support base 5 or the support mechanism 50 can comprise such materials as metals, ceramic, glass, plastics, resin or PCB (printed circuit board), just like the base or the socket of a traditional commercial bulb. According to a preferred embodiment, the support base 5 or the support mechanism 50 comprise a flexible metal compound. As shown in FIG. 6, one of the light emitting surfaces 34 of the LED chip 3 is the exposed surface in the structure essentially parallel to the support surface 210 of the substrate 2. According to one of the preferred embodiments of the present invention, the area of the first main surface 21 or the second main surface 22 shall be at least five times the total area of the plurality of light emitting surfaces 34 or the single area of the light emitting surface 34. Then there will be preferred area utilization rate, light emitting and heat dispersion efficiencies of the light emitting device 1.

Figure 7:
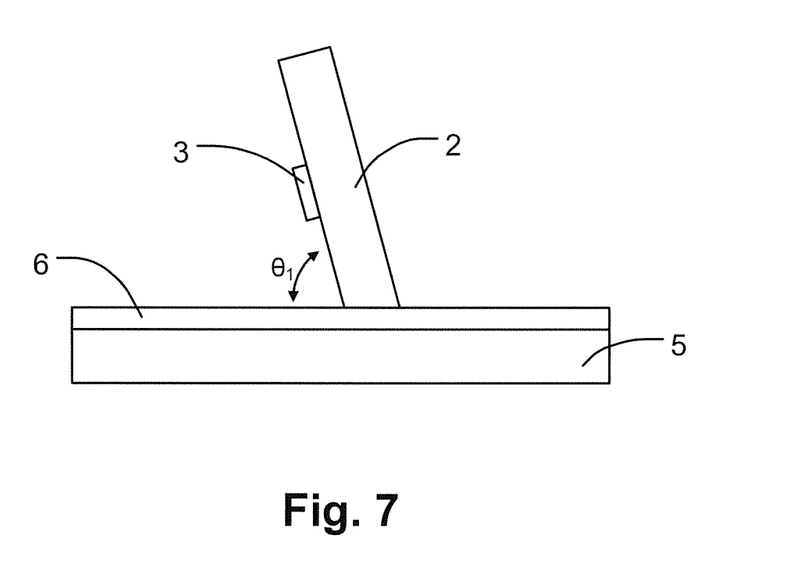
FIG. 7 shows a schematic diagram of the light emitting apparatus comprising the circuit board according to one embodiment of the present invention.

As shown in FIG. 7, the light emitting apparatus 11 of the present invention can further comprise a circuit board 6 on the support base 5 for coupling with an internal or external power supply. The circuit board 6 couples to the first and second conductors 23, 24 on the substrate 2 (not shown in the figure) for connecting electrically with the LED chips 3 and supplying the power required for emitting light. The circuit board 6 can also be integrated with the support base 5, therefore the LED chips 3 can be connected electrically with the support base 5 through the first and second conductors 23, 24 (not shown in the figure). Thereby, power can be directly provided to the LED chips 3 via the support base 5.

As shown in FIGS. 8A-9 and 14A-14D, in order to prevent pollution, corrosion, or wear on the substrate 2 and the LED chips 3 from ambient particles such as dust and moisture, the light emitting apparatus according to further embodiments of the present invention further comprises a lamp housing 7. The lamp housing 7 couples to the support base 5 or the support mechanism 50 and at least partially covers the substrate 2, wherein the form of the lamp housing 7 can be a tube, a bulb, or a box. Furthermore, the wavelength conversion layer 4 described above can be disposed optionally on the lamp housing 7.

Figure 8A:
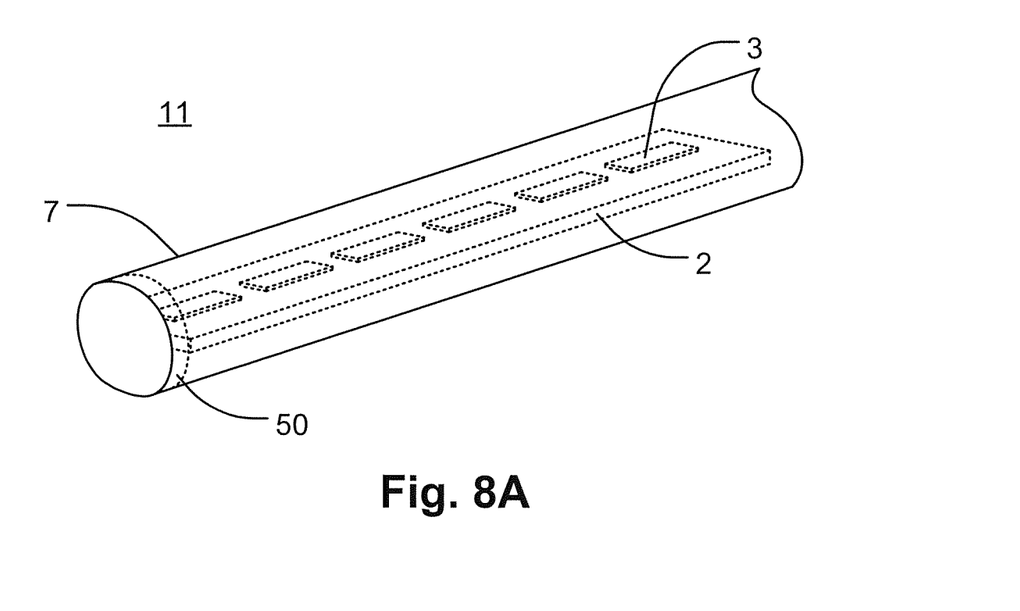
FIGS. 8A~8B show schematic diagrams of the light emitting apparatus comprising the lamp housing according to the embodiments of the present invention.
Figure 8B:
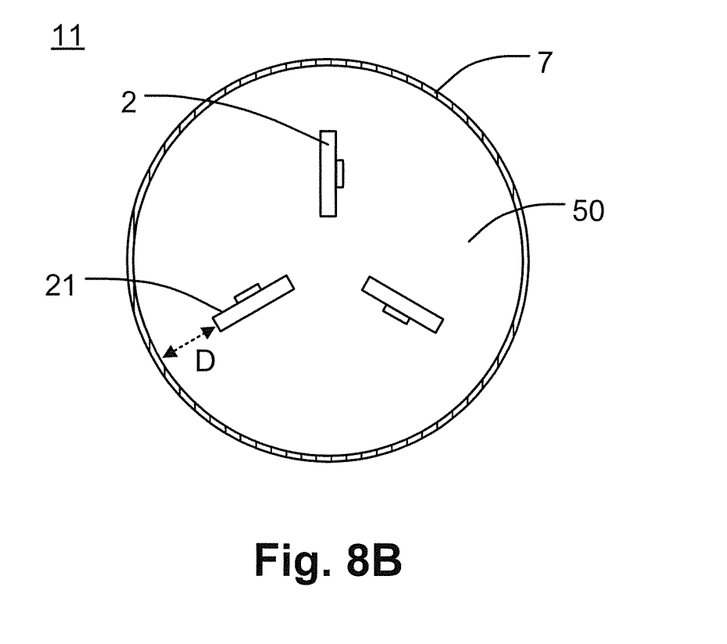

FIG. 8A shows a schematic diagram of a light emitting apparatus 11 according to an embodiment of the present invention. The light emitting apparatus 11 here is a tube, wherein the lamp housing 7 is a transparent tubular structure. Then the light emitting device 1 and the support mechanism 50 are disposed therein. In FIG. 8A, a single light emitting device 1 is disposed therein. As shown in FIG. 8B, when two or more light emitting devices 1 are disposed in the lamp housing 7, the first main surfaces 21 of the plurality of light emitting devices 1 can be arranged as mutually unparallel. In addition, at least a portion of the light emitting device 1 is disposed in the room formed by the lamp housing 7 and not tightly close to the inner walls of the lamp housing 7. According to a preferred embodiment, there is a distance D greater than 500 μm between the light emitting device 1 and the lamp housing 7. The lamp housing 7 can also be formed by molding, making the light emitting device 1 at least partially sealed and directly contacted by the lamp housing 7.

Figure 9:
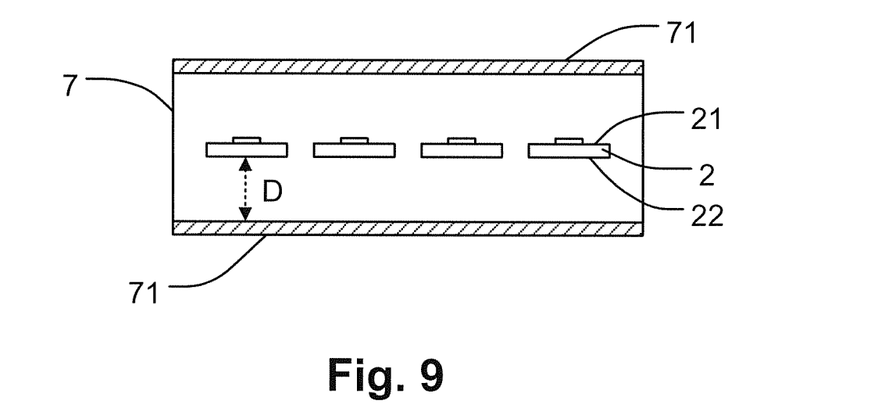
FIG. 9 shows a cross-sectional view of the light emitting apparatus for application according to one embodiment of the present invention.

According to another embodiment of the present invention, the light emitting apparatus 11 is a light box as shown in FIG. 9. The lamp housing 7, which is used as a signboard in this case, has at least one surface 71 mainly used for printing advertisements. Then the light provided by the first and second main surfaces 21, 22 of the light emitting device 1 according to the present invention form the backlight for the surface 71. The light emitting devices 1 can further be inclined or rotatable with a second angle $\theta_2$ relative to the surface 71, wherein the second angle $\theta_2$ is set between 0° to 45°. (In this case shown in FIG. 9, $\theta_2$ is 0°, and hence not shown.) According to a preferred embodiment, there is a distance D greater than 500 μm between the light emitting device 1 and the lamp housing 7. As described above, the lamp housing 7 can also be formed by molding, making the light emitting device 1 at least partially sealed and directly contacted by the lamp housing 7.

Figure 10:
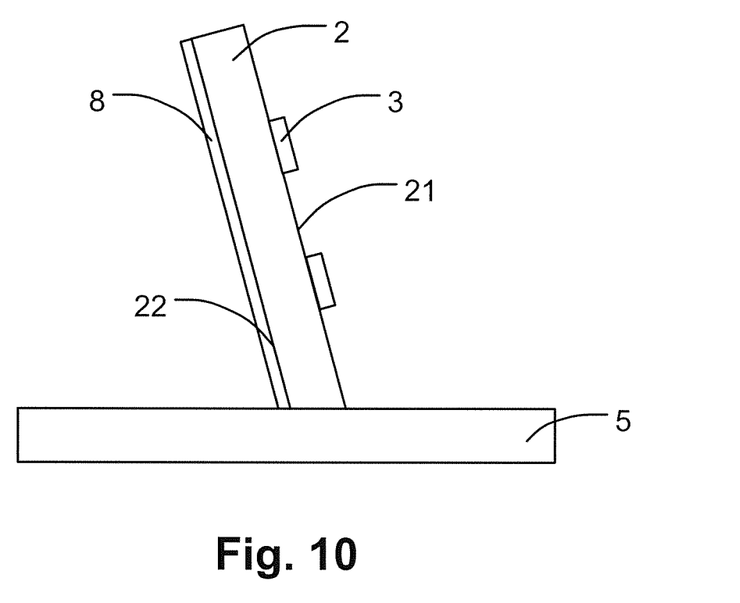
FIG. 10 shows a schematic diagram of the light emitting apparatus comprising the reflector according to one embodiment of the present invention.

According to still another embodiment of the present invention, as shown in FIG. 10, the light emitting device 1 further comprises a reflector 8 disposed on the second main surface 22. The reflector 8 can reflect at least a portion of the light emitted from the second main surface 22 of the substrate 2 and increase the light emitted from the first main surface 21. This reflector 8 can include, but is not limited to, at least one metal layer or one Bragg reflector comprising stacked multiple layers of dielectric thin films with different refractive indices.

Figure 11:
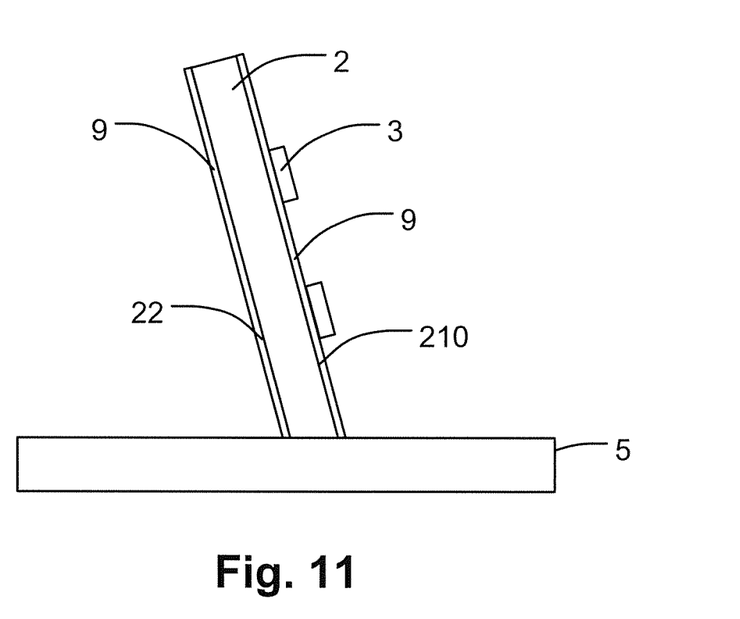
FIG. 11 shows a schematic diagram of the light emitting apparatus comprising diamond-like carbon film according to one embodiment of the present invention.
Figure 12A:
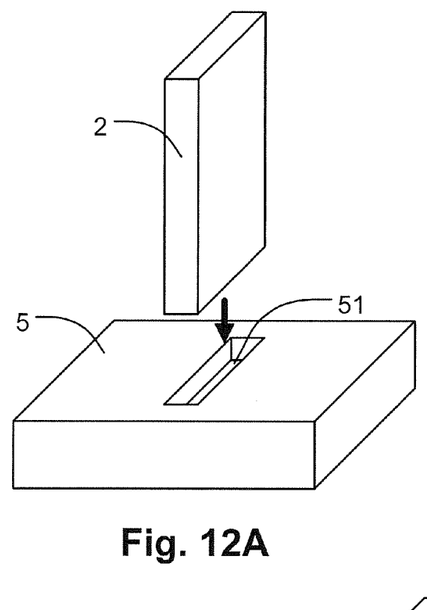
FIG. 12A~12C show schematic diagrams of the the light emitting apparatus according to the embodiments of the present invention.
Figure 12B:
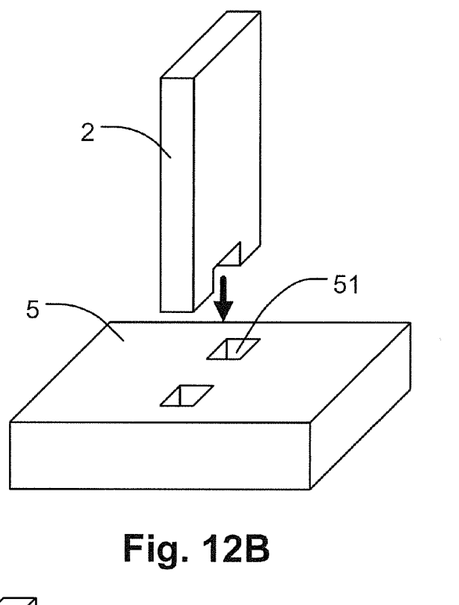
Figure 12C:
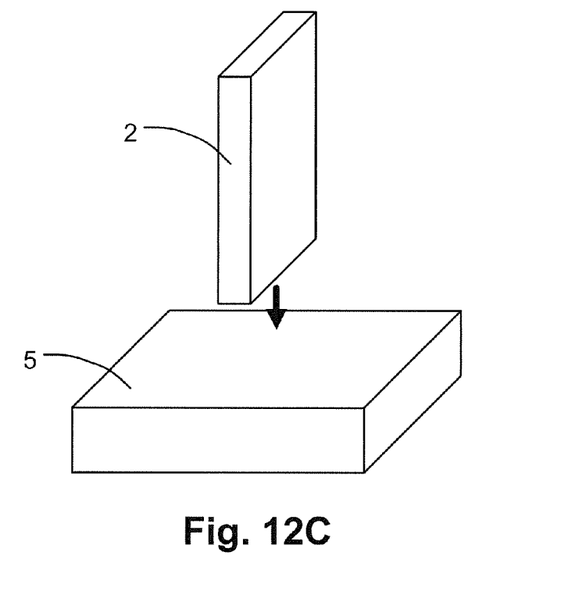

As shown in FIG. 11, the light emitting device 1 can further comprise diamond-like carbon (DLC) films 9 disposed optionally on the support surface 210 and the second main surface 22 for improving heat conduction and dissipation effects.

As shown in FIGS. 12A to 14D, there are some embodiments of the light emitting apparatus 11 according to the present invention. According to embodiments of the present invention shown in FIGS. 12A and 12B, the support base 5 can further comprise at least one slot or recess to form a socket or adapter 51, and correspondingly the substrate 2 can further comprise at least one guide pin or finger connector to connect with the adapter 51 on the support base 5. Wherein the conductors on the substrate 2 couple with electrodes of the support base 5 correspondingly through the mechanism described above. More particularly, when the substrate 2 comprises dual guide pins as shown in FIG. 12B, the polarity of the conductor on one of the guide pins can be different from the other conductor on another guide pin. There is also an embodiment as shown in FIG. 12C that the substrate 2 can be bonded with the support base 5 directly, wherein the bonding material used between the substrate 2 and the support base 5 can be selected from at least one element of the group comprising gold, tin, indium, bismuth, silver, conductive silicone and epoxy resin. Additionally, the substrate 2 and the top surface of the support base 5 form a first angle $\theta_1$ wherein the lighting effect of the light emitting apparatus according to the present invention can be changed accordingly.

Figure 13A:
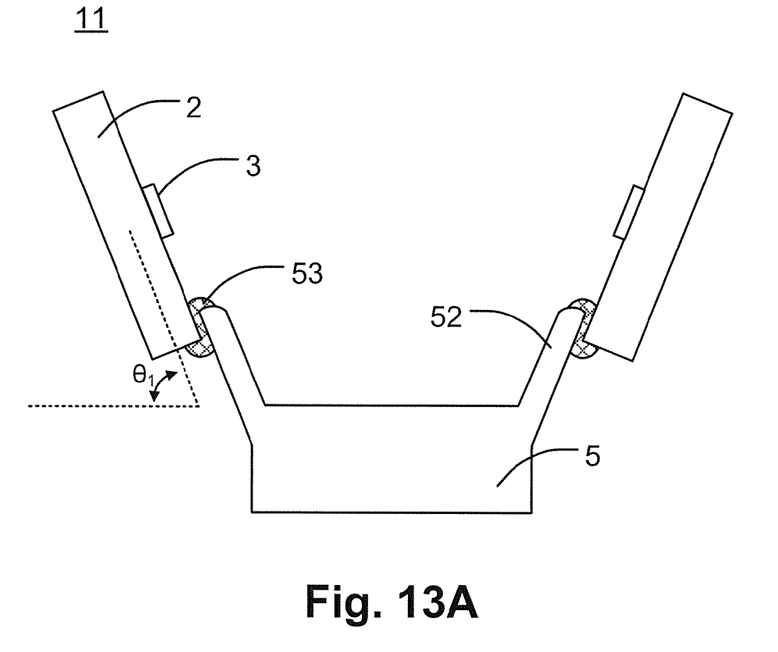
FIG. 13A~13B show schematic diagrams of the the light emitting apparatus according to the embodiments of the present invention.
Figure 13B:
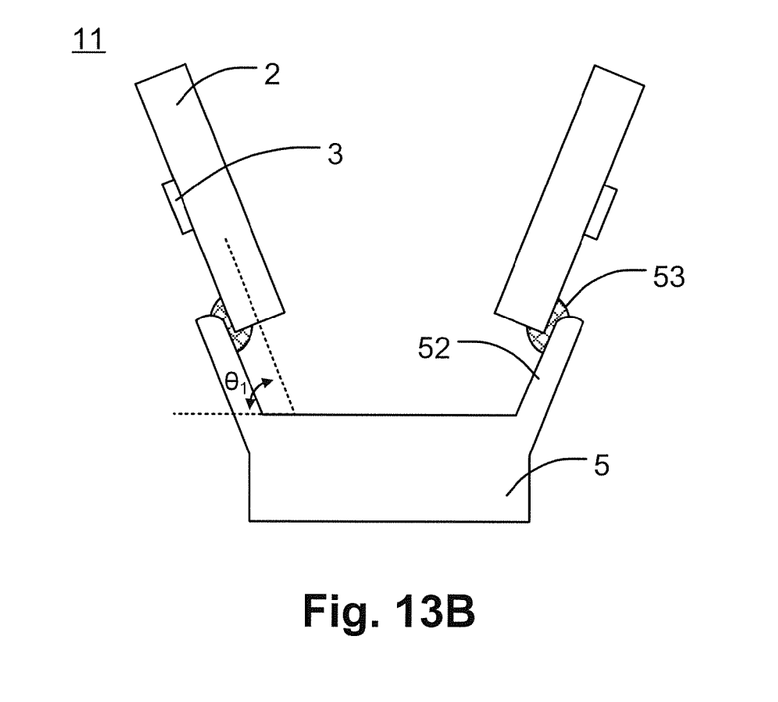
Figure 14A:
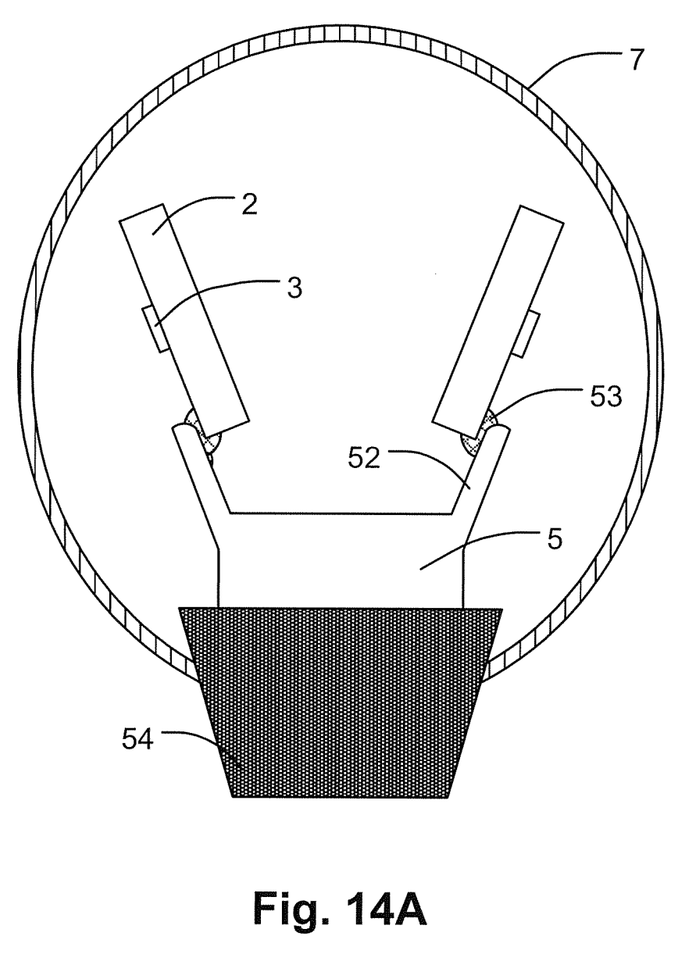
FIG. 14A~14D show schematic diagrams of the light emitting apparatus for various applications according to the embodiments of the present invention.
Figure 14B:
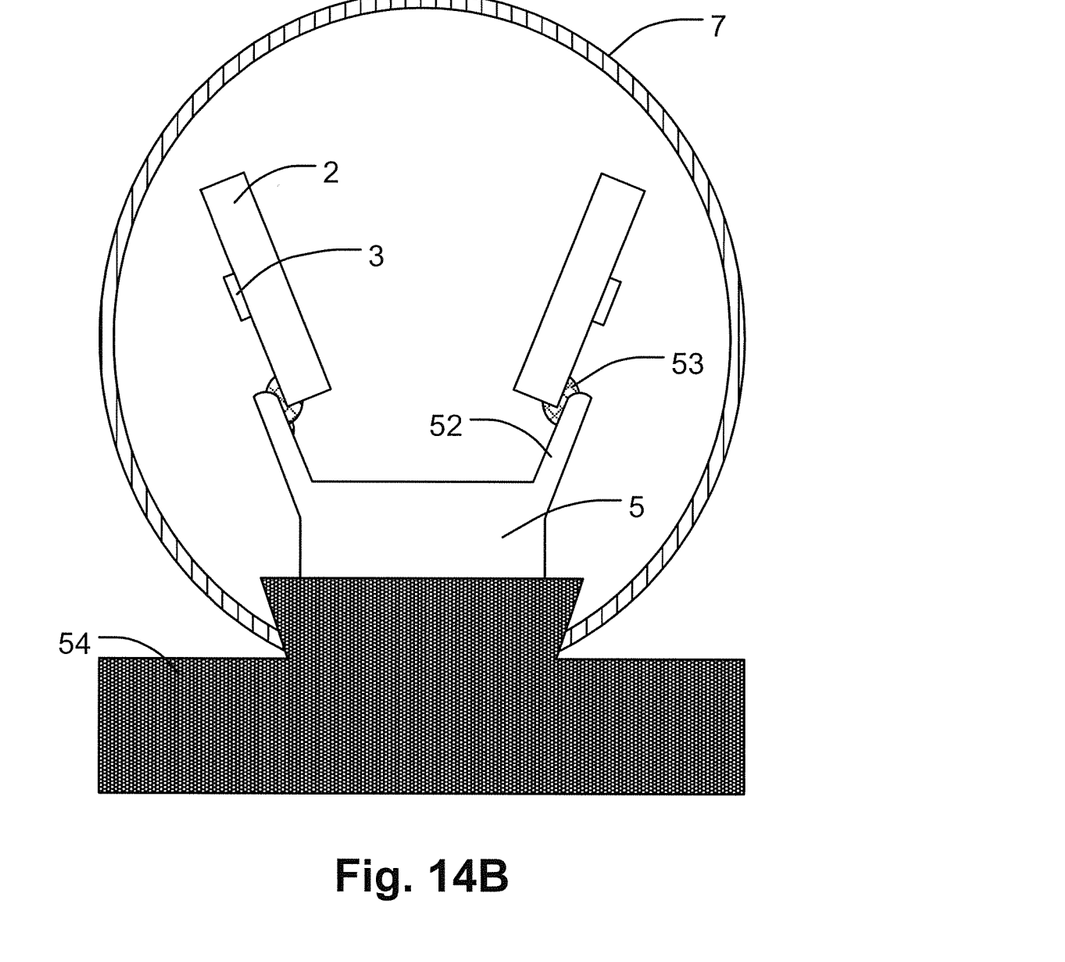
Figure 14C:
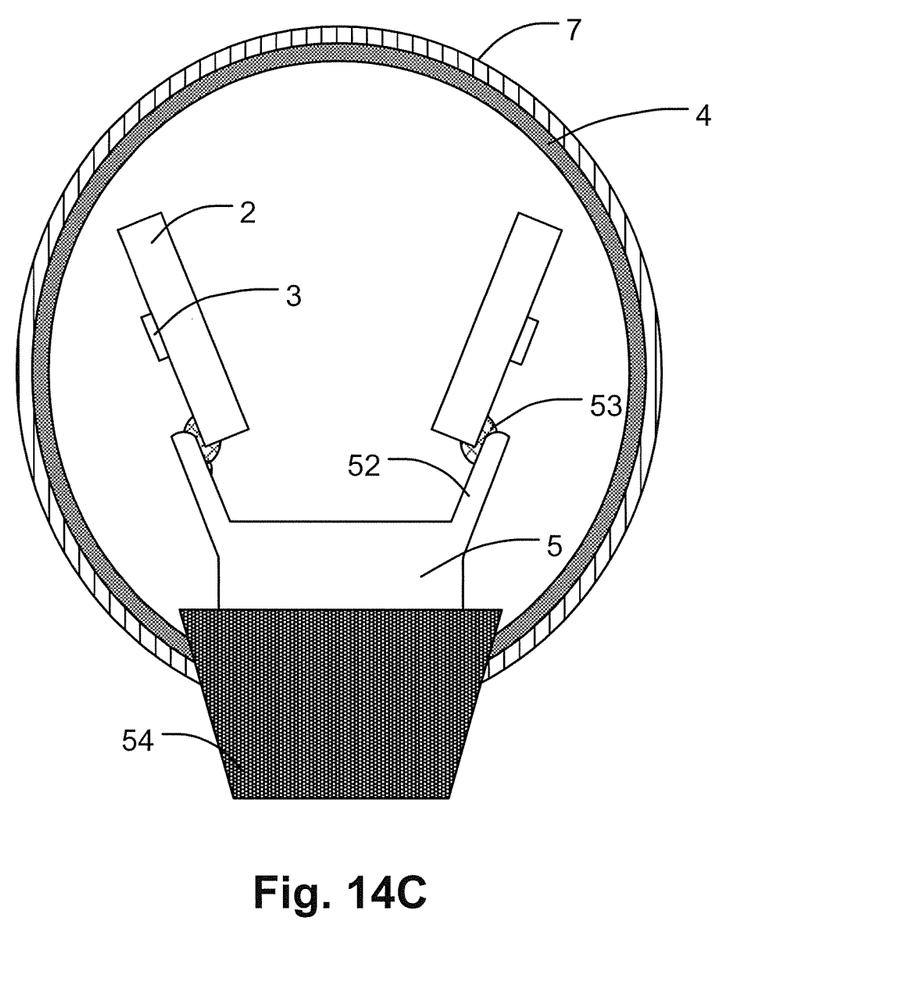
Figure 14D:
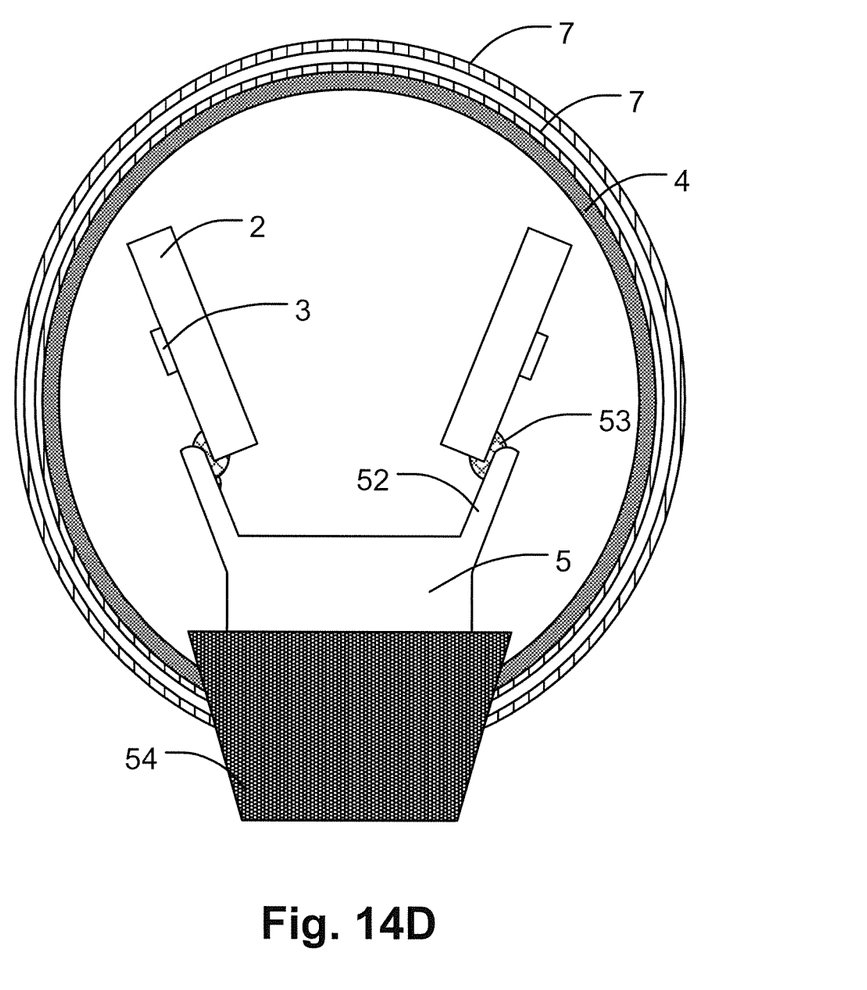

According to embodiments of the present invention shown in FIGS. 13A to 14B, the support base 5 can further comprise at least one support 52 coupling with at least one light emitting device 1 of the present invention. As shown in FIGS. 13A and 13B, there are at least two supports 52 spaced from each other wherein the support 52 can be integrated with the support base 5 or an individual component. Then the substrates 2 are coupled to the supports 52 by bonding layers 53, therefore the conductors 23, 24 on the substrate 2 can connect electrically to the power source accordingly. Further more, the substrates 2 can be disposed face-to-face as shown in FIG. 13A, back-to-back as shown in FIG. 13B, or face-to-back (not shown) for different lighting effects. Wherein the substrates 2 and the top surface of the support base 5 form the first angle $\theta_1$ wherein the lighting effect of the light emitting apparatus according to the present invention can be changed accordingly. Furthermore, the support 52 can be flexible, retractable, or rotatable therefore the lighting effect of the light emitting apparatus according to the present invention can be adapted to various applications.

As shown in FIGS. 14A to 14D, the light emitting apparatus 11 according to the embodiments shown in FIGS. 13A to 13B further comprises a lamp housing 7 and a lamp base 54. Wherein the support base 5 is disposed on the lamp base 54 and covered by the lamp housing 7, and the lamp housing 7 is connected with the lamp base 54. Furthermore, the lamp base 54 can be integrated with the support base 5. More particularly, the lamp base 54 in FIG. 14A can be connected with socket for traditional bulb so that the light emitting apparatus of the present invention can directly replace the traditional bulb. More particularly, the lamp base 54 in FIG. 14B can be a board like member of the light emitting apparatus 11 for different applications like a projector, a decoration wall, or an operating lamp according to the present invention. More particularly, the light emitting apparatus 11 according to the embodiment shown in FIG. 14C further comprises a wavelength conversion layer 4 disposed on the lamp housing 7, wherein the wavelength conversion layer 4 is disposed on the inner side of the lamp housing 7. Therefore, at least a portion of the light emitted from the light emitting device 1 can be converted to the light of another wavelength before leaving the lamp housing 7. More particularly, the light emitting apparatus 11 according to the embodiment shown in FIG. 14D further comprises an additional lamp housing 7 forming a double-layer lamp housing 7 for changing the decorative patterns and colors conveniently.

The foregoing description is only embodiments of the present invention, not used to limit the scope and range of the present invention. Those equivalent changes or modifications made according to the shape, structure, feature, or spirit described in the claims of the present invention are included in the appended claims of the present invention.

What is claimed is:

1. A light emitting apparatus, comprising:
    at least one light emitting device, including:
        a substrate, having a support surface; and
        at least one light emitting diode chip comprising a plurality of light emitting surfaces, disposed on said support surface of said substrate, one of said light emitting surfaces and said support surface forming a first main surface, wherein a light emitting angle of said light emitting diode chip is wider than 180°, and a portion of light emitted by said light emitting diode chip penetrates into said substrate from said support surface and emerges from a second main surface of said substrate opposing said first main surface; and
    a support base, coupled to said light emitting device, and forming a first angle with said substrate.

2. The light emitting apparatus of claim 1, further comprising a wavelength conversion layer disposed on said first main surface and/or on said second main surface of said light emitting device, wherein said wavelength conversion layer receives at least a portion of the light emitted by said light emitting diode chip and converts the wavelength thereof.

3. The light emitting apparatus of claim 2, wherein said wavelength conversion layer does not contact said light emitting diode chip.

4. The light emitting apparatus of claim 2, wherein said wavelength conversion layer is disposed on said first main surface and said second main surface, and the ratio of the fluorescent powder contained in said wavelength conversion layer located on different surfaces ranges from 1:05 to 1:3.

5. The light emitting apparatus of claim 1, wherein the difference between the color temperature of said first main surface and the color temperature of said second main surface is equal to or less than 1500K.

6. The light emitting apparatus of claim 1, further comprising a lamp housing, wherein at least a portion of said light emitting device is disposed in the room formed by said lamp housing.

7. The light emitting apparatus of claim 6, further comprising a wavelength conversion layer disposed on said lamp housing.

8. The light emitting apparatus of claim 6, wherein said lamp housing is coupled with said support base and at least partially covers said light emitting device.

9. The light emitting apparatus of claim 6, wherein said lamp housing is a tube, a bulb, or a box.

10. The light emitting apparatus of claim 6, wherein said lamp housing has at least one surface, and a second angle is formed between said surface and said first main surface or said second main surface of said light emitting device, said second angle ranging from 0° to 45°.

11. The light emitting apparatus of claim 6, wherein a distance is formed between said lamp housing and said substrate, and said distance is greater than 500 μm.

12. The light emitting apparatus of claim 1, wherein said first angle ranges from 30° to 150°.

13. The light emitting apparatus of claim 1, wherein the number of said light emitting device is more than one and the arrangement of said light emitting devices is symmetrical.

14. The light emitting apparatus of claim 13, wherein said arrangement is point- or line-symmetrical.

15. The light emitting apparatus of claim 1, and further comprising a circuit board connected electrically to both said light emitting device and said support base.

16. The light emitting apparatus of claim 1, wherein said support base includes a flexible metal compound.

17. The light emitting apparatus of claim 1, wherein said support base includes a support member and said light emitting device is disposed on said support member.

18. The light emitting apparatus of claim 17, further comprising a bonding layer coupling said light emitting device to said support member, wherein the material of said bonding layer is selected from the group consisting of gold, tin, indium, bismuth, silver, silicone, and epoxy resin.

19. The light emitting apparatus of claim 17, wherein said support member is flexible.

20. The light emitting apparatus of claim 17, wherein said support member is retractable.

21. The light emitting apparatus of claim 17, wherein said support member is rotatable.

22. The light emitting apparatus of claim 1, wherein the material of said substrate is selected from the group consisting of aluminum oxide, sapphire, glass, plastics, and rubber.

23. The light emitting apparatus of claim 1, wherein the thickness of said substrate is greater than or equal to 200 μm.

* * * * *